United States Patent [19]
Stamm

[11] 4,191,058
[45] Mar. 4, 1980

[54] LOW PROFILE PUSHBUTTON TUNER WITH IMPROVED CARRIAGE MOVING MECHANISM

[75] Inventor: Russell D. Stamm, El Paso, Tex.

[73] Assignee: General Instrument Corporation, Clifton, N.J.

[21] Appl. No.: 912,410

[22] Filed: Jun. 5, 1978

[51] Int. Cl.² .............................................. H03J 5/08
[52] U.S. Cl. ...................................... 74/10.33; 334/7
[58] Field of Search ............... 74/10.33, 10.35, 10.37, 74/10.6, 10.9, 10.27; 334/7

[56] References Cited

U.S. PATENT DOCUMENTS

| | | | |
|---|---|---|---|
| 2,310,003 | 2/1943 | Wells | 74/10.33 |
| 2,928,283 | 3/1960 | Teaf | 74/10.33 |
| 3,357,265 | 12/1967 | Thompson | 74/10.33 |
| 3,503,270 | 3/1970 | Ohashi | 74/10.33 |
| 3,946,344 | 3/1976 | Wilkihson | 74/10.33 X |

Primary Examiner—C. J. Husar
Assistant Examiner—Moshe I. Cohen
Attorney, Agent, or Firm—James & Franklin

[57] ABSTRACT

In a pushbutton tuner in which a tuning carriage is designed to be laterally positioned by a selected one of a plurality of carriage levers which are designed to slip with respect to the carriage as the carriage is moved, a reduced degree of force is required for moving the carriage by making the levers normally loosely associated with the carriage so that relative motion between them involves little or no friction, but in which the carriage lever operative at any given time to position the carriage is urged into snug engagement with the carriage thereby to eliminate backlash and achieve high accuracy tuning.

15 Claims, 8 Drawing Figures

LOW PROFILE PUSHBUTTON TUNER WITH IMPROVED CARRIAGE MOVING MECHANISM

The present invention relates to an improved pushbutton tuner, preferably one of minimal height, and more particularly to mechanical arrangements which enhance accuracy and repeatability of tuning yet permits the tuning to be accomplished with a minimal degree of force.

Pushbutton tuners have been employed for many years, because of the facility which they provide for tuning a communications set such as a radio receiver to one of a limited number of preselected stations or channels. There are two prime requirements which pushbutton tuners must meet. First, each time that a given pushbutton key is actuated it should tune the set accurately to the desired station, without requiring any fine tuning on the part of the user, since a fine tuning operation would detract from the speed and convenience which is the primary function of the pushbutton tuner. Second, each pushbutton key of the tuner must be readily adjustable to tune to different stations. This capability is required because the desires of the user as to the particular stations to be tuned by pushbutton actuation will change from time to time, and is particularly important when the tuner is installed in an automobile or other vehicle whose geographical location can change rapidly and where different stations can be received in those different localities.

Pushbutton tuners capable of meeting these requirements in a commercially satisfactory manner have been known for years. Over those years the general trend toward small size has resulted in modification of the standard pushbutton tuner structure in order to fit within smaller dimensional confines, but in the main those modifications have merely involved refinements of the standardized structure.

More recently, however, a new dimensional requirement has been imposed on pushbutton tuner design, a requirement of greatly minimized height, generally referred to in the industry as "low profile". This requirement has come about in the main because of increased popularity in the use of tape reproducers in automobiles. The tuners of automobile radios are generally located in the dashboard for ease of accessibility, and for the same reasons the so-called tape decks are also located in the dashboard, but since the space available on the dashboard for such accessories as radios and tape decks is quite limited, it has been thought necessary to greatly reduce the height of the tuner and to put the tape deck in the space thus made available.

The requirements for pushbutton tuner height minimization have been so rigorous that pushbutton tuners of the low profile type have required a substantial redesign over the previously standardized high profile tuners. That redesign in the main has resulted in structures which suffered from various drawbacks, primarily difficulty of assembly, testing and adjustment, lack of sturdiness and reliability, and lack of tuning accuracy particularly with regard to repeatability. These problems have arisen in large part from the relatively complicated mechanical movements and interconnections that have been employed in an effort to meet the stringent height requirements, or the excessively small, and hence unsturdy, mechanical parts used, or both.

A pushbutton tuner capable of satisfying the dimensional requirements and the functional requirements above referred to is disclosed and claimed in patent application Ser. No. 861,855, filed Dec. 19, 1977, entitled "Low Profile Pushbutton Tuner", filed in the name of Robert Monath and Russell D. Stamm and assigned to the assignee of this application. That tuner utilizes pushbutton keys which are of standardized type but which are oriented horizontally rather than vertically, by providing a part or carriage which is positioned by the standard adjustable cam carried by the operated pushbutton and which controls the tuning of the associated receiver in accordance with that position, by constraining that part or carriage to move in a straightline manner, preferably at right angles to the direction of movement of the pushbutton keys between their operative and inoperative positions and also optimally in the same direction as the tuning elements of the electrical tuner, by providing for each pushbutton key a pivoted arm which is pivotally positioned by the key cam and which is connected to the straightline-moving carriage by simple structure which eliminates backlash and enables the parts and particularly the carriage to have its desired straightline movement, by appropriately biasing each pushbutton key when it is in its operative position so that it will always accurately assume the same position when actuated, particularly insofar as that position affects the positioning of the carriage produced by that operative pushbutton key, and by mounting the parts in sub-assemblies respectively on the base and cover of the tuner housing in such a fashion as to facilitate assembly and testing of the tuner components. Each of these characteristics contributes substantially to the improved functioning of the tuner of the present invention, and cumulatively they make for exceptionally good manufacturing, assembly and operational characteristics.

While that tuner did function in a highly desirable manner, it was subject to one disadvantage which, while not disabling, was inconvenient. Because each of the pivoted arms were frictionally associated with the straightline-moving carriage, that frictional association being provided to eliminate backlash and thus produce the desired tuning degree of accuracy, each time that a key was actuated and the carriage was moved all of those pivoted arms had to slide with respect to the carriage against which they were resiliently urged, and hence a substantial amount of friction was developed, which friction had to be overcome each time that a key was depressed to change the tuning of the set. A substantial degree of force therefore had to be exerted on the tuning key that was actuated at any given time. Since ease of operation is a prime factor insofar as consumer acceptance of a given tuning mechanism is concerned, the need for overcoming the substantial frictional forces involved between the pivoted arms and the carriage was a drawback to the specific construction of the aforementioned pushbutton tuner.

The prime object of the present invention is to devise a pushbutton tuner structure in which the pushbutton actuation requires a minimal degree of force.

It is another object of the present invention to devise a pushbutton tuner structure capable of meeting the current low-height requirements of the industry in an improved fashion, particularly with respect to the amount of force that has to be exerted on the pushbutton.

It is a further object of the present invention to devise such a structure which uses to the maximum extent standardized pushbutton tuner parts and arrangements of time-tested sturdiness and reliability.

It is yet another object of the present invention to provide a pushbutton tuner in which the accuracy and repeatability of tuning effected by a given button is exceptionally high, but in which the force required to be exerted on that given pushbutton to effect tuning is minimal.

It is still a further object of the present invention to devise a pushbutton tuner assembly, and particularly one having a low profile, whose cost, ease of manufacture and assembly, sturdiness and accuracy is as good as or better than the pushbutton tuners, high-or low-profile, which have previously been used in the industry.

These objectives are accomplished, in accordance with the present invention, by providing a plurality of articulately mounted arm means, one for each pushbutton, which are all operatively associated with a carriage which positions the operative means of the tuner, in insuring that those arm means normally engage the carriage loosely, with little or no friction obtained between them and the carriage, and with means being provided to cause the arm means associated with the particular pushbutton then being actuated to engage the carriage firmly and tightly, thereby to substantially eliminate backlash and improve tuning accuracy and repeatability. It is preferred that the firm or tight engagement between the operative pivoted arm means and the carriage does not come about until the carriage has reached or substantially reached its new position. Hence when the carriage is moved to its new position there is little or no friction which occurs between it and the non-operative arm means, and the friction which occurs between it and the operative arm means, if it occurs at all, is truly minimal.

This is accomplished, in the preferred embodiments here illustrated, by forming each arm means as an assembly of a pair of independently movable arms, each of those arms being positioned by a different portion of the cam carried by the pushbutton. Each arm of a given arm assembly is preferably loosely pivotably mounted, and hence the arms of each non-operative arm assembly exert virtually no resistance to movement as the carriage is moved and virtually no friction arises between them and the moving carriage. The cam on the actuated pushbutton will engage the arm of the operative arm assembly, usually first one arm and then the other, and when the pushbutton is pushed all the way in the two arms of the assembly will be forcibly pivoted into firm engagement with the carriage, thereby accurately to position the carriage, but the amount of friction involved between the arm of the operative arm assembly and the carriage as the carriage is being moved to its new position is minimal, and both arms of the arm assembly are usually not firmly urged into engagement with the carriage until the carriage is at or almost at its final adjusted position. Hence friction is virtually minimized.

To the accomplishment of the above, and to such other objects as may hereinafter appear, the present invention relates to the structure of a tuner assembly as defined in the appended claims and as described in this specification, taken together with the accompanying drawings in which:

Figure 1:
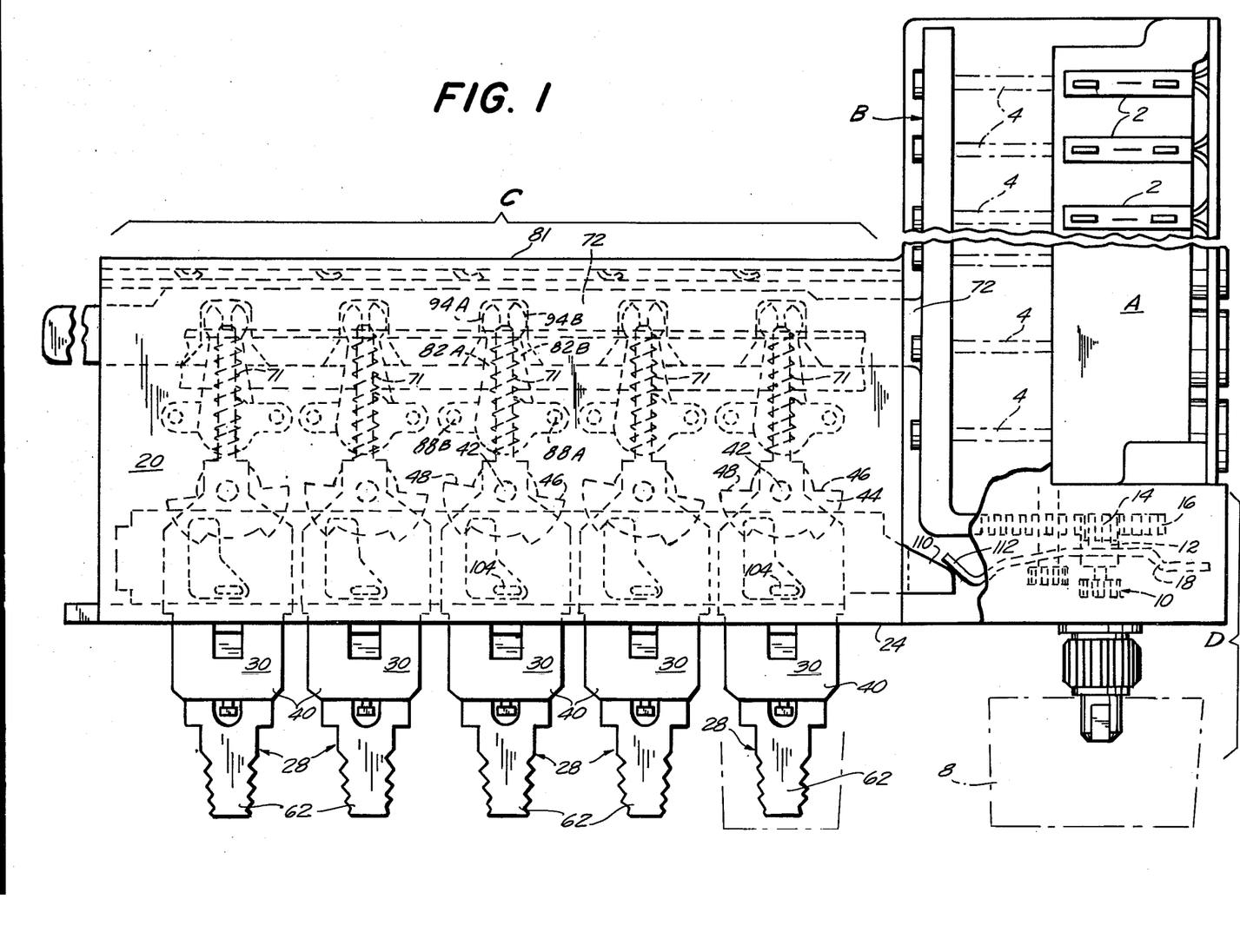
FIG. 1 is a top plan view of one embodiment of the tuner of the present invention.

As may be seen from FIG. 1, the tuner embodiment here disclosed comprises an electrical tuning system generally designated A which is tuned by the adjustable positioning of a movable control member generally designated B. As here specifically disclosed the tuning system A may comprise a plurality of coils received within housings 2, which coils are tuned by the adjustable telescoping thereinto of cores 4, those cores being fixedly but adjustably mounted on a tuning bar 6. That tuning bar 6 is moved toward and away from the coil housings 2, thereby causing the cores 4 to telescope thereinto and out therefrom.

The tuner A, as disclosed, is provided with two different tuning systems, the pushbutton tuning system of the present invention, generally designated C, and a continuous tuning system generally designated D. The details of the continuous tuning system D are not part of this invention (they are described more in detail in the copending patent application Ser. No. 861,857, filed Dec. 19, 1977, entitled "Tuner Driving Mechanism Permitting Play in Location of Input Member", with Robert F. Welch and Russell D. Stamm as inventors and assigned to the assignee of this application), and hence it will be sufficient for the purposes of this application to state simply that rotation of a manually accessible knob 8 will, through gearing generally designated 10 and a clutch generally designated 12, be communicated to the tuning bar 6 by means of a pinion 14 rotated by the clutch 12 and a rack 16 connected in some appropriate manner to the tuning bar 6 and engaged by the pinion 14. As here specifically disclosed the rack 16 is integral with the tuning bar 6, as it well may be insofar as the low profile aspects of the present invention are concerned. The aforementioned copending application, however, discloses a preferred non-integral connection between the parts 6 and 16, which forms no part of the invention here claimed. A declutch arm 18 is operatively connected to the clutch 12 and is mounted for pivotal movement about its right-hand end as viewed in FIG. 1 between the clutch engaging position in which it is shown in FIG. 1 and a clutch-disengaging position in which it is pivoted in a clockwise direction from the position that is shown in FIG. 1. When the clutch 12 is engaged, rotation of the knob 8 will cause the bar 6 to translate laterally between its extreme positions, thereby tuning the receiving set.

Figures 7, 7A:
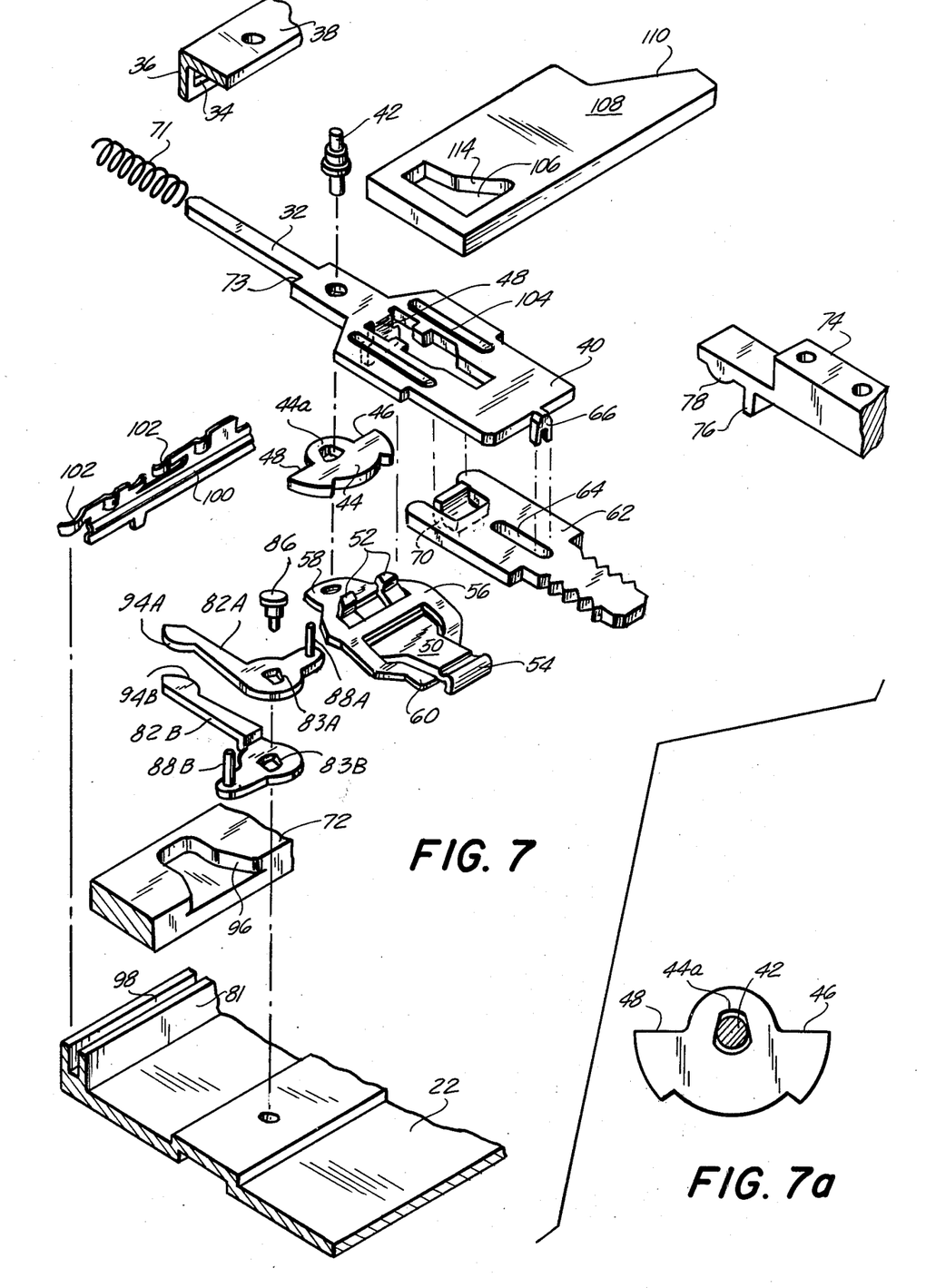
FIG. 7 is a three-quarter-perspective exploded view of the parts shown in FIGS. 2-6.
FIG. 7a is a top plan view of one of the cams with a mounting stud passing therethrough.

It is to the pushbutton tuner arrangement generally designated C that the instant invention relates. The pushbutton tuner arrangement C comprises a housing defined by an upper part or cover 20 and a bottom part or base 22, and extending from the front wall 24 of that housing, through an appropriate opening 26, are a plurality of pushbutton keys generally designated 28, here shown, for purposes of exemplification, as five in number. The structure of those keys is essentially that which pushbutton keys have commonly assumed since 1942 (see Teaf U.S. Pat. No. 2,301,090, Schwartz U.S. Pat. No. 2,489,544 and Allen U.S. Pat. No. 2,659,236). It comprises a key body 30 provided with a narrow forwardly extending portion 32 slidably received within an aperture 34 in the depending portion 36 of a rear key guide 38 which is secured to the housing cover 20. The other end 40 of the key body extends out through the opening 26. A stud 42 is secured to the key body 30, and pivotally mounted on that stud is a cam 44 having cam surfaces 46 and 48 located to opposite sides of the axis about which the cam 44 is pivotable. As may best be seen in FIG. 7a the cam 44 is provided with an aperture 44a which has tapered sides defining what may be called a pear-shape, through which the stud 42 passes.

Figures 2, 3:
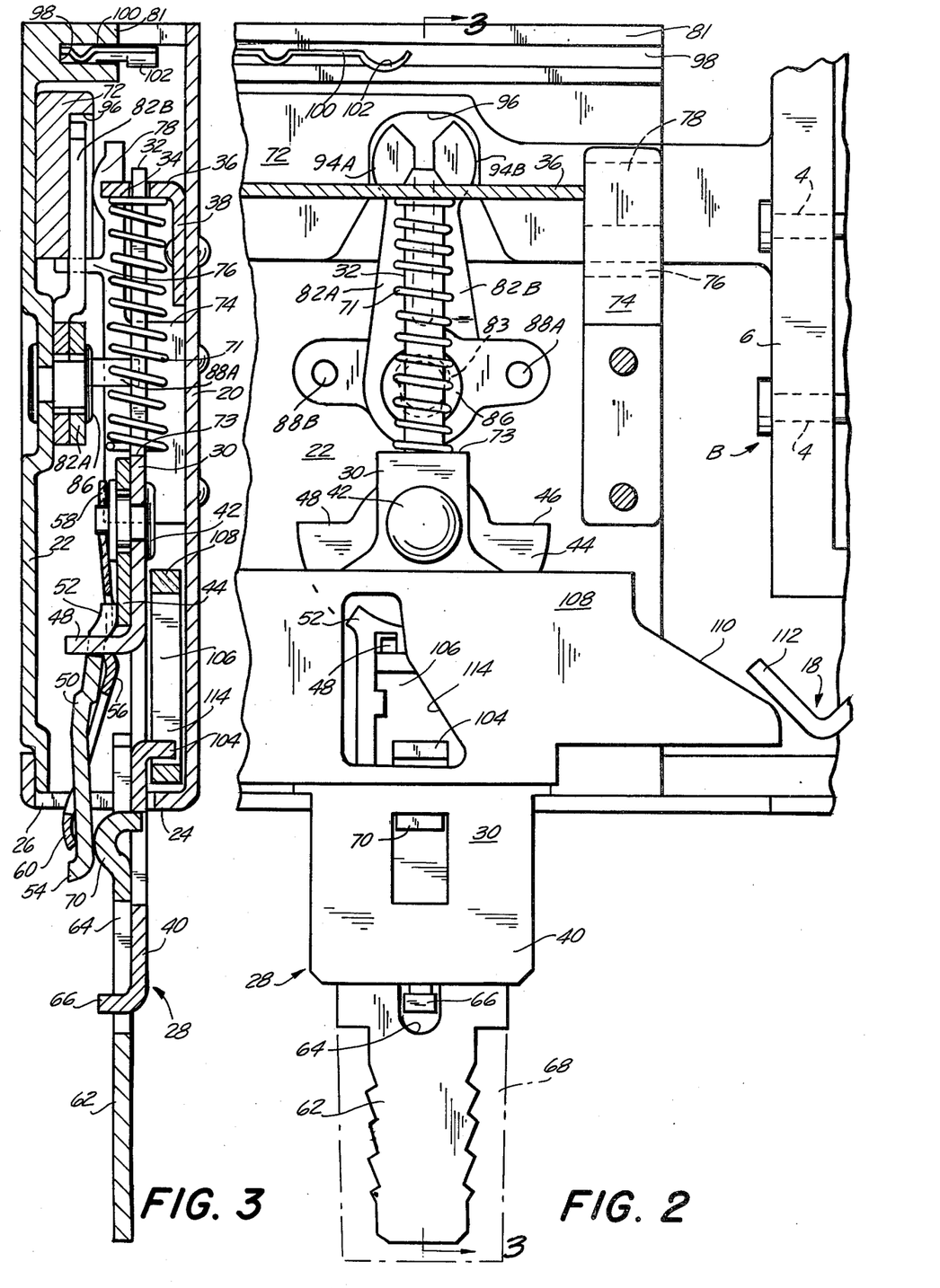
FIG. 2 is a fragmentary top plan view on an enlarged scale of a single pushbutton key and associated parts, the key being shown in its undepressed or inoperative position.
FIG. 3 is a cross-sectional view taken along the line 3—3 of FIG. 2.
Figure 4:
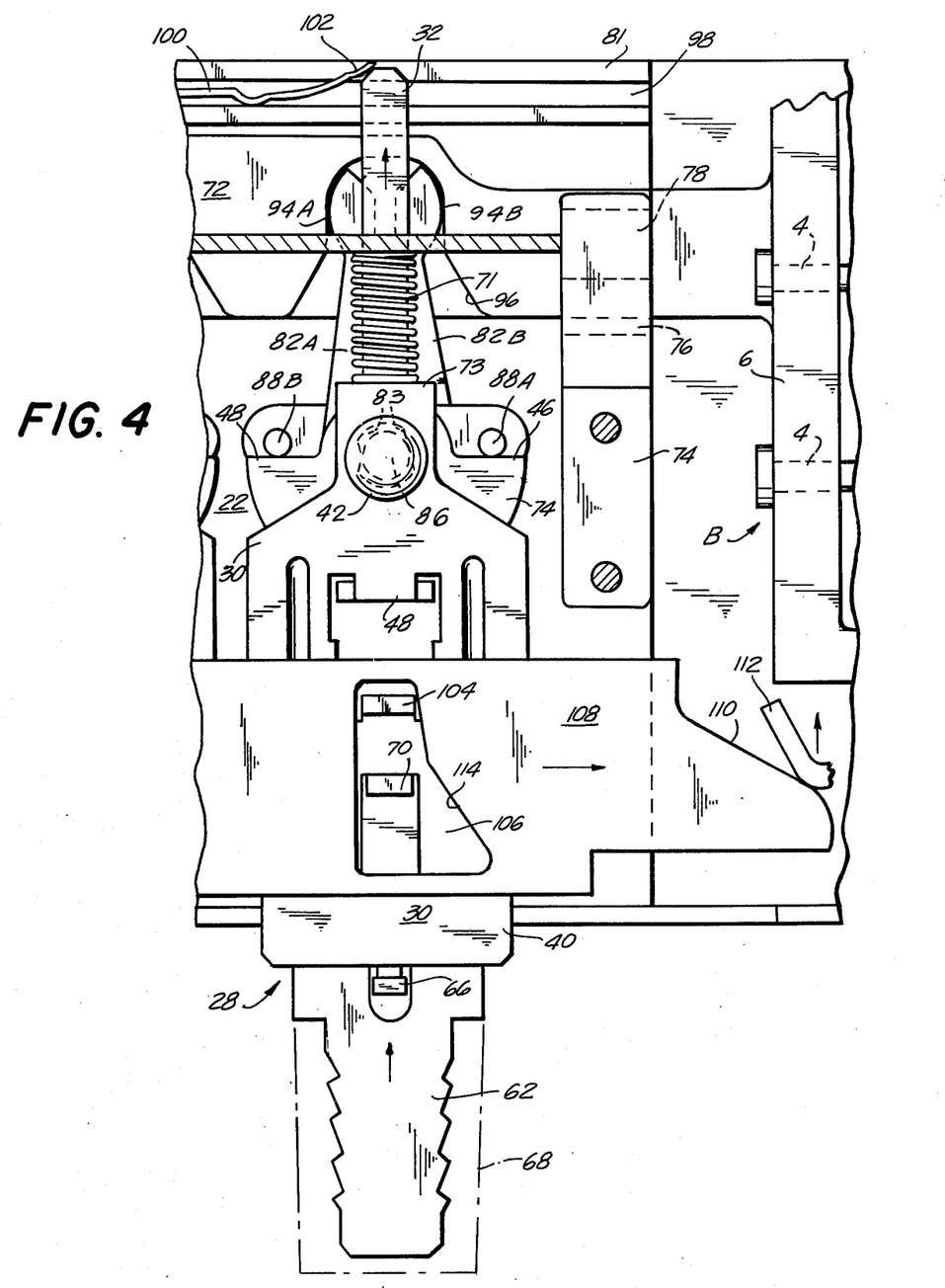
FIG. 4 is a view similar to FIG. 2 but showing the cam on the pushbutton key in a different pivotal position.

A portion of the key body 40 is upstruck at 48, and a locking lever 50 is pivotally mounted on that upstruck portion, one end 52 of the locking lever 50 engaging the upper surface of the cam 44 and the other end 54 of the locking lever 50 extending a substantial distance to the left of the upstruck portion 48 as viewed in FIG. 3. A spring 56 is mounted on the key body 30 with one of its ends 58 stressed against the stud 42 and its other end 60 stressed against the end 54 of the locking lever 50 so as to bias the end 54 downwardly as viewed in FIG. 3.

Slidably mounted on the key body 30 is a key extension 62 provided with an elongated slot 64 within which a lug 66 downstruck from the end 40 of the key body 30 is relatively snugly received. The outwardly extending end of the key extension 62 is designed to have a pushbutton 68 secured thereto. The other end of the key extensions 62 is provided with a raised camming portion 70 designed to cooperate with the locking lever 50 and cause it to pivot to a position in which it locks the cam 44 in adjustable position. A spring 71 is received over the forwardly extending portion 32 of the key body 30 and is compressed between the downstanding portion 36 of the rear key guide 38 and the shoulder 73 on the key body 30, thus tending to bias the pushbutton key assembly to its outer or inoperative position.

The key assemblies will therefore be seen to be essentially standardized devices the reliability, dependability and accuracy of which are time-tested. It is a significant advantage of the structure of the present invention that it uses such standardized key assemblies. The only essential difference between the key assemblies as here disclosed and those which have become standard in the industry is that in the tuner of the present invention those key assemblies are oriented laterally rather than vertically, that is to say, the cam surfaces 46 and 48 of the cams 44 extend to one side of the other of the key body, rather than above and below the key body as in a conventional tuner.

Positioning of the tuning bar 6 by the pushbutton turner assembly C is effected by means of a bar or carriage 72 which is preferably rigidly connected to the tuning bar 6 and, as here shown, is made of one piece with the tuning bar 6. That carriage 72 is mounted for straightline movement to the right and to the left as viewed in the figures, corresponding to the straightline translation of the tuning bar 6 between its extremes of movement. To that end the carriage 72 is located between the housing base 22 and a pair of spaced pressure pads 74 secured to the housing in any appropriate manner, each pad 74 having a vertical flange 76 over which an edge of the carriage 72 is adapted to slide and having a protruding portion 78 designed to engage the lower surface of the carriage 72.

The apparatus as thus far described is essentially the same as that disclosed in the aforementioned application Ser. No. 861,857. In that application a plurality of carriage levers were provided, one for each pushbutton key, each pivotably mounted on the base 22, each designed to be rotatably positioned by means of the key cam 44 with which it is operatively associated, and each being bifurcated and spring received within apertures 96 in the carriage 72. Because the bifurcated ends of each of those carriage levers was resiliently compressed within the associated aperture 96, and because when the carriage 72 moved the carriage lever ends had to slide with respect to the aperture surfaces against which they were resiliently pressed, an appreciable amount of friction was developed between each of the carriage levers and each of their respective apertures 96 whenever carriage 72 was moved, that is to say, whenever a new pushbutton was depressed. The friction involved had to be overcome by the force exerted on the pushbutton, and this was a source of inconvenience to the users of that device.

In accordance with the present invention, in order to convert the pivotable position of a tuning key cam 44 accurately into a corresponding lateral position of the carriage 72 and the tuning bar 6, thereby accurately to control the degree to which the tuning cores 4 penetrate the tuner coils in the housings 2, and to do this with minimal friction when the carriage 72 is moved, thus calling for the exertion of minimal force on the operative pushbutton, in the disclosed preferred embodiment a plurality of carriage lever assemblies 82 are provided, one for each pushbutton key, those assemblies comprising upper and lower levers 82A and 82B respectively, each pair of levers 82A and 82B being pivotably mounted on the base 22 by means of a stud 86, the stud passing through a pear-shaped apertures 83A and 83B in the respective lever 82A and 82B. Lever 82A is provided with an upstanding ear of pin 88A and lever 82B is provided with an upstanding ear or pin 88B, the ears 88A and 88B extending into the plane of travel of the key cam 44 with which it is associated so as to engage the cam surfaces 46 and 48 respectively. The outer ends of the levers 82A and 82B are provided with curved outer surfaces 94A and 94B respectively which are designed to be received within an aperture 96 in a carriage 72, the width and depth of the aperture 96 being such as to freely receive the outer ends of the levers 82A and 82B therewithin, one above the other. The shape of the apertures 96 is such that their height, as viewed in FIG. 5, provides for an appreciable degree of movement of the ends of the carriage levers 82A and 82B as viewed in FIG. 3.

Figures 5, 6:
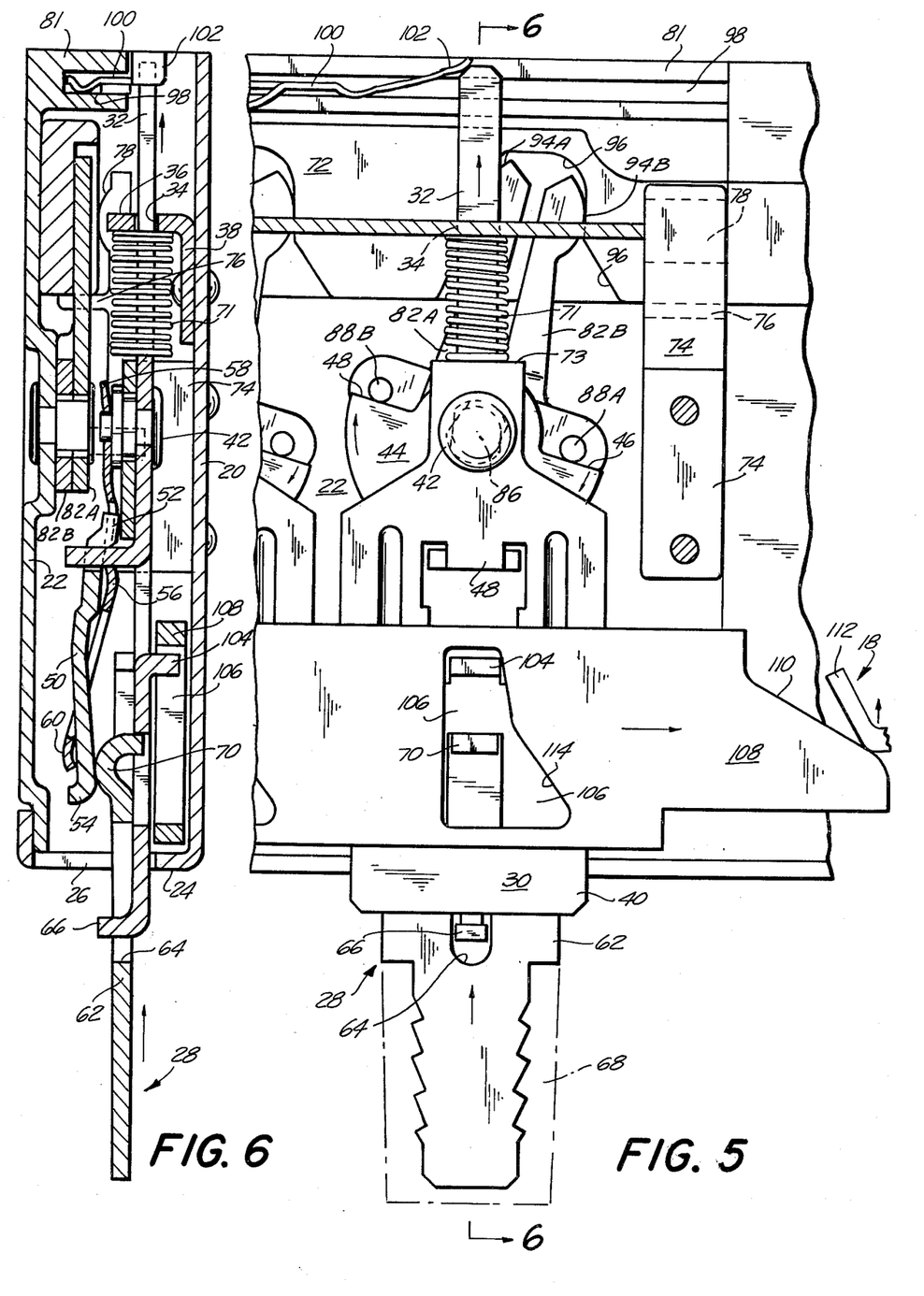
FIG. 5 is a view similar to FIG. 4 but showing the position that the parts assume when the pushbutton key of FIG. 4 is pushed into its operative position.
FIG. 6 is a cross-sectional view taken along line 6—6 of FIG. 5.

The rear wall 81 of the base 22 is provided with a slot 98, and in that slot a spring sheet 100 is mounted, that sheet having a plurality of spring fingers 102, one for each of the pushbuttons which, as may best be seen from FIG. 5, are so located as to engage the side of the forwardly extending portion 32 of a key body 30 when that key is pushed inwardly to its operative position, thereby to bias the operative key body 30 into engagement with the right-hand side of the opening 34 in the rear key guide 36, the rear key guide 36 thus functioning as a stop fixing the lateral position of that key body 30, and hence the lateral position of the cam 44 carried thereby whenever that key is pushed in.

Extending up from each key body 30 is a lug 104 which projects into an opening 106 in a declutch bar 108 mounted for lateral slidable movement between the key bodies 30 and the housing cover 20. The right-hand end of the declutch bar 108 is provided with an inclined surface 110 adapted to cooperate with the generally correspondingly inclined tip 112 of the declutch lever 18. The openings 106 in the declutch bar 108 are so shaped as to have an inclined cam surface 114 normally positioned opposite the lug 104, and any suitable means is provided normally to urge the declutch bar 108 to the left as viewed in FIG. 2 so that the inclined surface 114 is opposite the lug 104.

The functioning and mode of operation of the pushbutton tuner of the present invention will in the main be apparent from the above description and from a knowledge of the manner in which the standardized pushbutton keys here utilized have functioned in the past. When a given pushbutton is to be set to tune a particular selected station, the tuner is first tuned to that station manually through rotation of the knob 8. As a result the carriage 72 will be rigidly and accurately laterally positioned corresponding to the desired tuning position of the cores 4, and this will cause corresponding pivoting of each of the levers 82A and 82B of each carriage lever assembly 82 about the axis of the studs 86. Because the levers 82A and 82B are freely pivotably mounted, and because their ends are freely received within their respective apertures 96, and because under these conditions no spreading force is exerted on the arms 82A and 82B of each of the carriage arm assemblies 82, there will be little or no friction occurring between the carriage arm assemblies 82 and the carriage 72, and hence the tuning can be manually effected with great ease.

Next the key extension 62 of the pushbutton which is to be associated with the particular station then tuned is pulled out, moving the cam 70 away from the end 54 of the locking lever 50, thus releasing the cam 44 on that pushbutton for pivotal adjustment about the axis of the stud 42. The pushbutton is then moved in, and the initial engagement of the cam 70 against the end 54 of the locking lever 50 will cause the lock body 30 to move inwardly, compressing the spring 71 until the surfaces 46 and 48 of the free-to-pivot cam 44 engage the ears 88A and 88B respectively on the associated carriage lever assembly 82. Each of the carriage lever arms 82A and 82B will pivot outwardly until its curved surface 94A or 94B is pressed against the inner surface of the associated carriage aperture 96, after which those arms 82A and 82B can pivot no more. Thus the position of the operative arms 82A and 82B will, via their ears 88A and 88B respectively, rotatably position the cam 44. At this time the tip of the forwardly projecting key body extension 32 will have moved into engagement with the associated spring finger 102, and that finger will push the key body 30, 32, to the right as viewed in the drawings to a stop position defined by the right side of the opening 34 in the guide 38. Once the key body 30 has moved inwardly as far as it can go, continued inward pressure on the pushbutton will move the key extension 62 inwardly relative to the key body 30 to the position shown in FIGS. 2 and 3, where the cam portion 70 will force itself under the end 54 of the locking lever 50 and thus forcibly pivot that locking lever in a clockwise direction as viewed in FIG. 3 so as to press the cam 44 between the locking lever end 52 and the key body 30, thereby reliably to retain the cam 44 in its pivotally adjusted position. Release of inward pressure on the pushbutton will let the spring 71 expand, thus bringing the key body 30 and the key extension 62 to their normal inoperative position as shown in FIG. 2.

This operation is repeated for each of the pushbutton keys, and since each key will be associated with the tuning of a different station, and hence with a different lateral position of the carriage 72 and a different pivotal position of the associated carriage lever 82, the cams 44 on each of the pushbuttons will be fixed in different pivoted positions, as shown illustratively in FIG. 1.

Thereafter when a particular station associated with a given pushbutton is to be tuned that pushbutton is pushed in. One or the other of the cam surfaces 46 and 48 will engage the associated pin 88A or 88B, the associated arm 82A or 82B will be pivoted, and this will cause the carriage 72 to move toward its new tuning position. Thus there will be some friction occurring between that arm 82A and 82B and the carriage 72. However, normally the other of the two arms 82A or 82B will not yet have its pin 88 engaged by the other cam surface, and hence it will not be urged strongly against the aperture 72, so that little or no friction will be engendered by that arm. Moreover, the arms 82A and 82B of each of the carriage arm assemblies 82 which is associated with a non-actuated pushbutton will likewise be loosely received within their respective carriage apertures 96, and hence little or no friction will be engendered between those carriage arms 82A and 82B and the carriage 72.

As the actuated pushbutton approaches its fully-in position the other one of the cam surfaces 46 and 48 will engage the pin 88A or 88B on the thus-far non-pressed arm 82A or 82B of the operative carriage arm assembly 82, pressing its curved surface 94 against the inner surface of the operative carriage aperture 96. Hence at this last inward movement of the pushbutton both of the cam surfaces 46 and 48 will become operative, via the pins 88A and 88B on the levers 82A and 82B, to accurately and positively position the carriage 72 without backlash. During all of the movement of the carriage 72, it will be remembered, the other carriage assemblies 82 have their ends loosely received within the carriage apertures 96 so that little or no friction is engendered thereby. The action of the spring finger 102 on the key body 30 thus moved into operative position ensures that the key body will always, whenever it is operative, take up the same lateral position, and hence it will reliably produce, for a given pivotal position of its cam 44 thereon, the same lateral position of the carriage 72, and hence the same tuning for the receiving set.

When the pushbutton is moved in, the lug 104 depending therefrom will engage the cam surface 114 on the declutch bar 108 and will move that bar to the right, its cam surface 110 engaging with the tip 112 of the declutch lever 18 and causing the lever 18 to move to disengage the clutch 12, so that the manual drive D offers no appreciable resistance to the movement of the tuning bar 6.

The particular arrangement of parts here disclosed greatly facilitates assembling and testing of the pushbutton tuner. The pushbutton assembly, including the key body 30, the key extension 62, the cam 44, the locking lever 50 and the locking lever spring 56, together with the springs 71 and the declutching bar 108 are all assembled to one another and mounted on the housing cover 20. The carriage 72 and the carriage levers 82 are assembled to one another and to the base plate 22 of the housing. Each of those subassemblies carried respectively by the housing cover 20 and base plate 22 are capable of being separately tested and operated, so that such repairs or adjustments as are required on either one may be made before the entire unit is assembled. Moreover, no great precision is required in bringing the two subassemblies into operative relationship; all that is required is to place the cover 20 on the housing 22.

By reason of the arrangement of parts into subassemblies as described, the use of standard pushbutton key assemblies, the use of a carriage 72 which moves in a straightline direction, the arrangement and interconnection of parts which permits that straightline movement, and the lateral biasing of each pushbutton key when it is in operative position by means of simple and reliable spring fingers, a pushbutton tuner is produced which, although it has an acceptable low profile, is nevertheless at least the equal of prior art pushbutton tuners of high profile, in cost, ease of assembly and adjustment, and accuracy and repeatability of tuning.

Moreover, the relationship between the carriage arm assemblies 82 and the carriage 72 is such that the carriage arm assemblies 82 exert little or no resistance to tuning movement of the carriage 72 when that tuning is accomplished manually, and when pushbutton tuning is accomplished those carriage arm assemblies 82 associated with the non-actuated pushbuttons exert virtually no resistance to the movement of the carriage 72, and even the carriage arm assembly 82 associated with the actuated pushbutton produces only a minimal amount of friction with respect to the carriage 72, so that pushbutton tuning is accomplished through the exertion of a truly minimal amount of force. It is significant that this great improvement in ease of manipulation is accomplished without any sacrifice in the accuracy or repeatability of the tuning produced.

While but a single embodiment of the present invention has been here specifically disclosed, it will be apparent that many variations may be made therein, all within the scope of the invention as defined in the appended claims.

I claim:

1. In a tuner assembly comprising a support, a part movably mounted on said support, a tuner, an operative connection between said part and said tuner whereby said tuner is tuned in accordance with the position of said part, and a plurality of manually actuated keys mounted on said support and individually movable in a given direction between operative and inoperative positions, each of said keys having a cam thereon adjustably positionable about an axis, a plurality of arm means, one for each key, articulately mounted on said support, said part having a plurality of apertures, a portion of each of said arm means being received in a corresponding aperture, each cam, when its key is in operative position, engaging and moving the corresponding arm means to position said part and thereby control the tuning of said tuner; the improvement which comprises said arm means normally loosely engaging said part, the cam of the operative key and the corresponding arm means comprising means effective to cause that arm means to firmly engage said part, thereby accurately to position said part substantially without lost motion; said arm means comprising a pair of arms independently articulately mounted on said support and each having a portion received in a corresponding aperture in said part, each of said cams having a pair of cam surfaces, each of said surfaces being effective to engage a different one of said arms and to urge said different one of said arms into said firm engagement with said part as the corresponding key moves to its said operative position.

2. The tuner assembly of claim 1, in which both of the arms of a given arm means have a portion received in the same aperture in said part.

3. The tuner assembly of claim 2, in which said part is mounted on said support for movement in a straight line substantially perpendicular to the direction of movement of said keys.

4. The tuner assembly of claim 3, in which the portion of said arms received within a given aperture respectively engage opposite sides of said aperture when positioned by said cam.

5. The tuner assembly of claim 2, in which the portion of said arms received within a given aperture respectively engage opposite sides of said aperture when positioned by said cam.

6. The tuner assembly of claim 1, in which each of the arms of a given arm means are pivotally mounted on said support.

7. The tuner assembly of claim 6, in which both of the arms of a given arm means have a portion received in the same aperture in said part.

8. The tuner assembly of claim 7, in which said part is mounted on said support for movement in a straight line substantially perpendicular to the direction of movement of said keys.

9. The tuner assembly of claim 8, in which the portion of said arms received within a given aperture respectively engage opposite sides of said aperture when positioned by said cam.

10. The tuner assembly of claim 7, in which the portion of said arms received within a given aperture respectively engage opposite sides of said aperture when positioned by said cam.

11. The tuner assembly of claim 1, in which each of the arms of a given arm means are coaxially pivotally mounted on said support.

12. The tuner assembly of claim 11, in which both of the arms of a given arm means have a portion received in the same aperture in said part.

13. The tuner assembly of claim 12, in which said part is mounted on said support for movement in a straight line substantially perpendicular to the direction of movement of said keys.

14. The tuner assembly of claim 13, in which the portion of said arms received within a given aperture respectively engage opposite sides of said aperture when positioned by said cam.

15. The tuner assembly of claim 12, in which the portion of said arms received within a given aperture respectively engage opposite sides of said aperture when positioned by said cam.

* * * * *